United States Patent
Malone et al.

(10) Patent No.: US 7,907,403 B2
(45) Date of Patent: Mar. 15, 2011

(54) ACTIVE HEAT SINK WITH MULTIPLE FANS

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 889 days.

(21) Appl. No.: 11/258,626

(22) Filed: Oct. 25, 2005

(65) Prior Publication Data

US 2007/0091563 A1    Apr. 26, 2007

(51) Int. Cl.
*H05K 7/20* (2006.01)

(52) U.S. Cl. .... 361/695; 361/690; 361/697; 165/104.33; 257/707; 415/47

(58) Field of Classification Search .......... 361/688–690, 361/692, 694–695, 697, 699, 700, 704; 165/80.4, 165/104.33, 121, 185; 454/184; 257/E23.088, 257/E23.099
See application file for complete search history.

(56) References Cited

U.S. PATENT DOCUMENTS

| | | | | |
|---|---|---|---|---|
| 5,572,403 A | * | 11/1996 | Mills | 361/695 |
| 5,745,041 A | * | 4/1998 | Moss | 340/635 |
| 5,787,971 A | * | 8/1998 | Dodson | 165/121 |
| 5,793,610 A | * | 8/1998 | Schmitt et al. | 361/695 |
| 5,810,072 A | * | 9/1998 | Rees et al. | 165/80.3 |
| 5,896,917 A | * | 4/1999 | Lemont et al. | 165/80.3 |
| 5,953,209 A | * | 9/1999 | Chiu | 361/697 |
| 6,005,770 A | * | 12/1999 | Schmitt | 361/695 |
| 6,031,717 A | | 2/2000 | Baddour et al. | |
| 6,058,011 A | | 5/2000 | Hardt et al. | |
| 6,101,459 A | | 8/2000 | Tavallaei et al. | |
| 6,181,556 B1 | * | 1/2001 | Allman | 361/690 |
| 6,181,557 B1 | * | 1/2001 | Gatti | 361/695 |
| 6,241,006 B1 | * | 6/2001 | Shih | 165/80.3 |
| 6,269,001 B1 | | 7/2001 | Matteson et al. | |
| 6,343,014 B1 | | 1/2002 | Lin | |
| 6,401,807 B1 | | 6/2002 | Wyler et al. | |
| 6,477,050 B1 | | 11/2002 | Herring et al. | |
| 6,537,019 B1 | | 3/2003 | Dent | |
| 6,538,888 B1 | * | 3/2003 | Wei et al. | 361/697 |
| 6,587,340 B2 | * | 7/2003 | Grouell et al. | 361/695 |
| 6,621,700 B1 | | 9/2003 | Roman et al. | |
| 6,637,502 B1 | * | 10/2003 | North et al. | 165/80.3 |
| 6,639,794 B2 | * | 10/2003 | Olarig et al. | 361/687 |
| 6,646,878 B2 | * | 11/2003 | Chan | 361/695 |
| 6,688,379 B2 | * | 2/2004 | Huang et al. | 165/121 |
| 6,727,820 B2 | * | 4/2004 | Pedoeem et al. | 340/584 |
| 6,775,139 B2 | * | 8/2004 | Hsueh | 361/697 |
| 6,781,834 B2 | * | 8/2004 | Nair et al. | 361/697 |
| 6,785,140 B2 | | 8/2004 | Artman et al. | |
| 6,837,785 B2 | * | 1/2005 | Soderlund | 454/184 |
| 6,862,182 B1 | | 3/2005 | Roman et al. | |
| 6,885,555 B2 | | 4/2005 | Greco | |
| 7,018,169 B2 | * | 3/2006 | Phillip et al. | 415/60 |
| 7,277,280 B2 | * | 10/2007 | Peng | 361/695 |
| 7,339,791 B2 | * | 3/2008 | Hoover et al. | 361/711 |
| 7,345,875 B2 | * | 3/2008 | Elkins | 361/695 |
| 2003/0007867 A1 | * | 1/2003 | Chang | 415/220 |
| 2004/0130868 A1 | * | 7/2004 | Schwartz et al. | 361/687 |
| 2004/0256085 A1 | | 12/2004 | Barsun et al. | |
| 2005/0151555 A1 | * | 7/2005 | Lewis et al. | 324/760 |
| 2005/0280990 A1 | * | 12/2005 | Goodenough et al. | 361/695 |

(Continued)

*Primary Examiner* — Jayprakash N Gandhi
*Assistant Examiner* — Courtney Smith

(57) ABSTRACT

In an active heat sink, a heat sink comprises a plurality of heat sink fins and multiple fans configured in a redundant arrangement coupled to the heat sink.

20 Claims, 15 Drawing Sheets

U.S. PATENT DOCUMENTS

| | | | |
|---|---|---|---|
| 2006/0032616 A1* | 2/2006 | Yang | 165/104.33 |
| 2006/0048932 A1* | 3/2006 | Rubenstein et al. | 165/185 |
| 2007/0053154 A1* | 3/2007 | Fukuda et al. | 361/687 |
| 2007/0081888 A1* | 4/2007 | Harrison | 415/47 |
| 2007/0091571 A1* | 4/2007 | Malone et al. | 361/699 |
| 2007/0139884 A1* | 6/2007 | Foster et al. | 361/697 |

* cited by examiner

ACTIVE HEAT SINK WITH MULTIPLE FANS

BACKGROUND OF THE INVENTION

An active heat sink is a heat sink with a fan either directly attached or attached in close proximity to the heat sink. A common active heat sink arrangement includes a horizontal tube-axial fan positioned on top of vertically extending fins. The fan creates relatively high velocity airflow across heat sink fins, enabling efficient heat removal. Active heat sinks may be used in various applications and devices including, for example, servers, work stations, and others.

SUMMARY

In accordance with an embodiment of an active heat sink, a heat sink comprises a plurality of heat sink fins and multiple fans configured in a redundant arrangement coupled to the heat sink.

BRIEF DESCRIPTION OF THE DRAWINGS

Embodiments of the invention relating to both structure and method of operation may best be understood by referring to the following description and accompanying drawings.

DETAILED DESCRIPTION

Fan failure may be a fundamental problem with active heat sink designs. Fans typically fail due to physical damage or failure, for example when bearing lubricant evaporates. Fan failure may cause a component cooled by the heat sink to overheat, potentially resulting in permanent damage or catastrophic failure of an electronics system which is cooled at least partly using an active heat sink.

To reduce or eliminate the possibility of electronic system damage due to failure of the fan in an active heat sink multiple fans may be combined with the active heat sink.

Figure 1A:
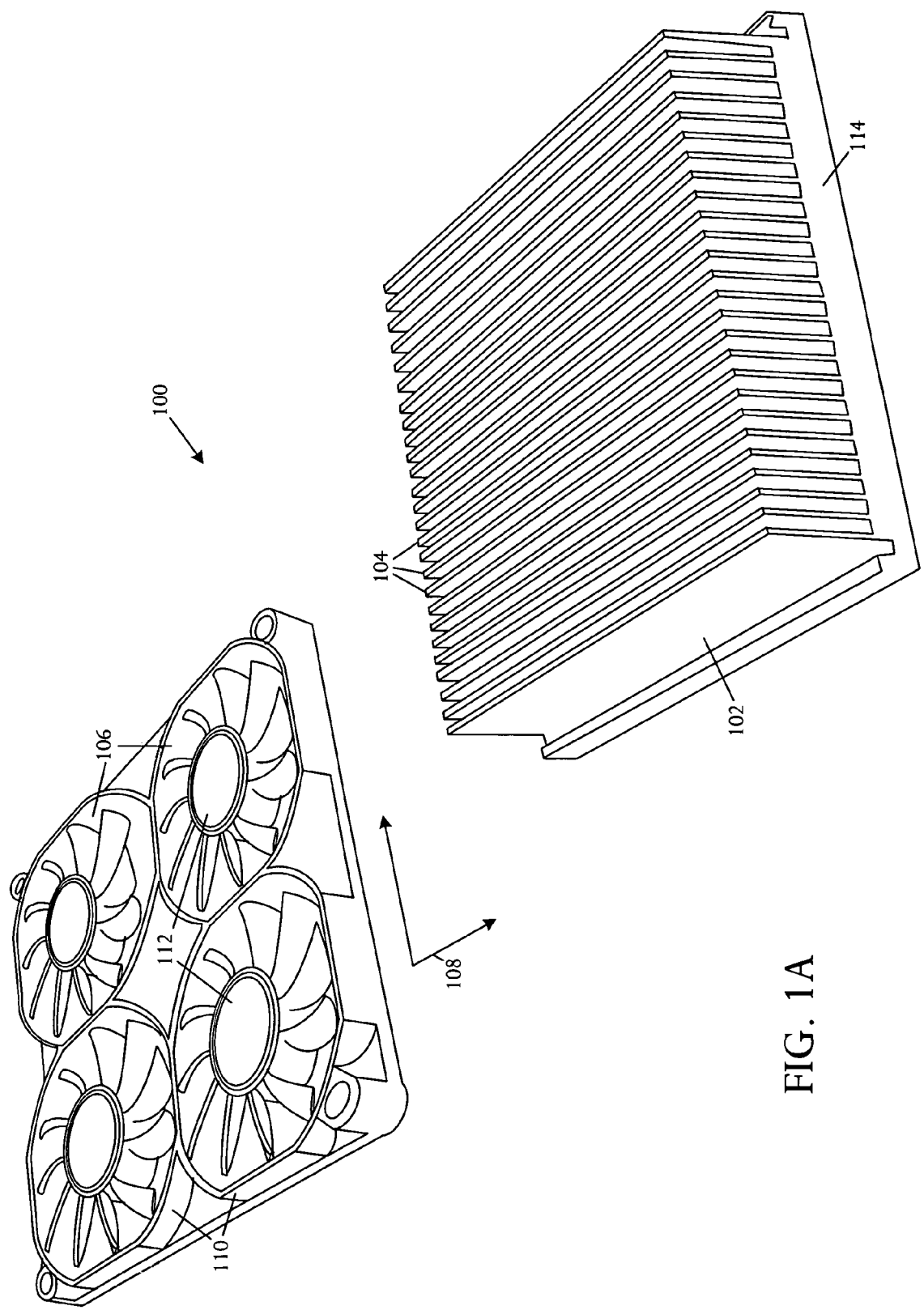
FIGS. 1A and 1B are perspective pictorial diagrams respectively depicting exploded and combined views of an embodiment of an active heat sink with multiple fans.
Figure 1B:
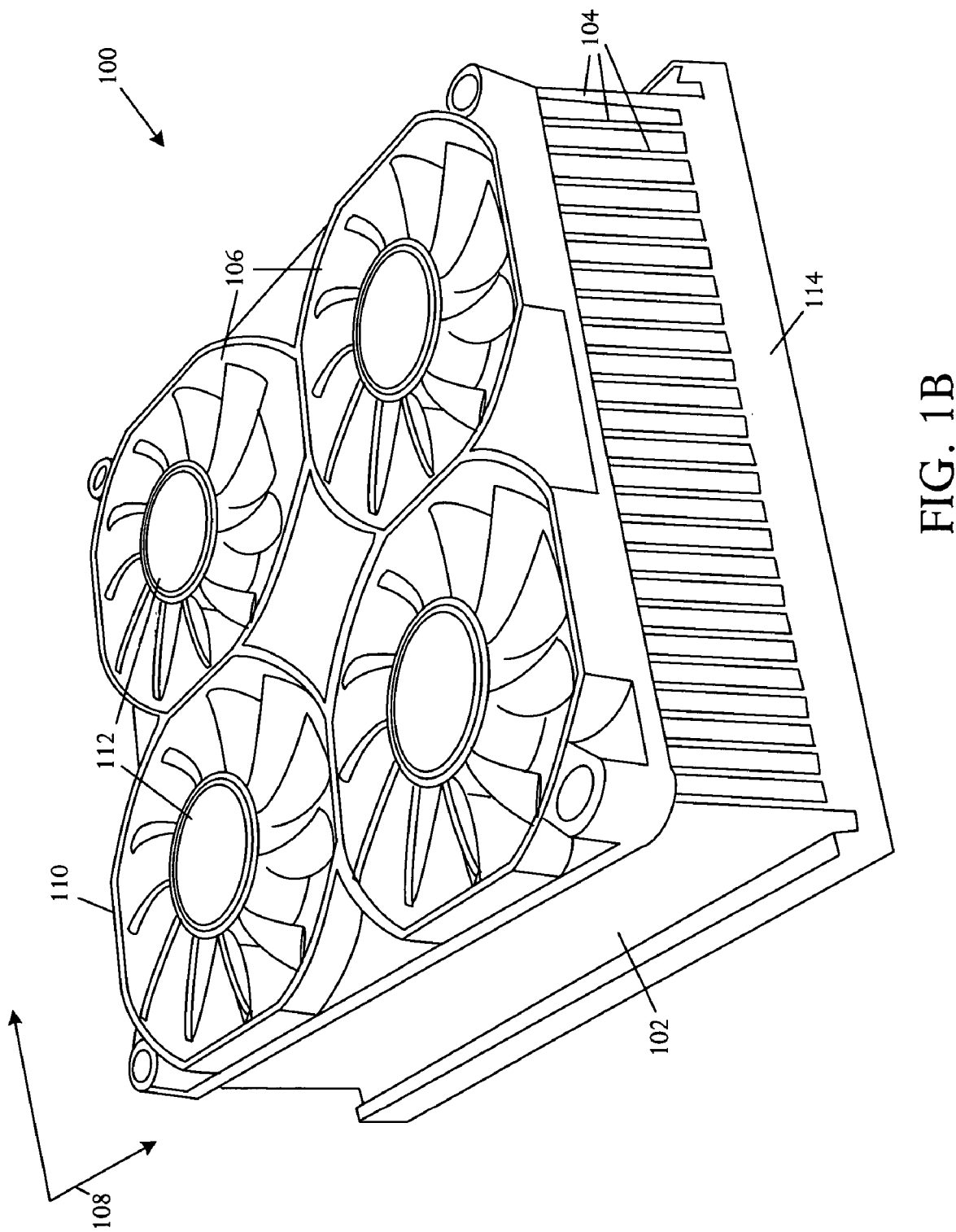

Referring to FIGS. 1A and 1B, perspective pictorial diagrams respectively illustrate exploded and combined views of an embodiment of an active heat sink 100 comprising a heat sink 102 with a plurality of heat sink fins 104 and multiple fans 106 configured in a redundant arrangement coupled to the heat sink 102.

The illustrative embodiment includes multiple horizontal tube-axial fans 106 arranged in a plane 108 overlying an arrangement of vertically-extending heat sink fins 104. A tube-axial fan 106 is an axial fan with a tubular housing 110 configured to confine airflow along a rotating shaft 112.

As shown in FIG. 1A, the active heat sink 100 can be produced by providing a heat sink 102. The multiple fans 106 are combined in a redundant integral arrangement. The integral multiple fan cooling element is attached to the heat sink 102 to form a combined structure.

FIGS. 1A and 1B illustrate the multiple fans 106 configured in a parallel redundant arrangement, thereby generating airflow in redundant parallel pathways. The fans 106 draw air into spaces between the heat sink fins 104, driving impingement cooling of an electronic device 114 attached to or abutting the heat sink 102. Airflow exits through the sides of the heat sink 102.

The illustrative active heat sink 100 includes four fans. In other embodiments, any number of fans may be combined within space constraints of a particular design.

Figure 2:
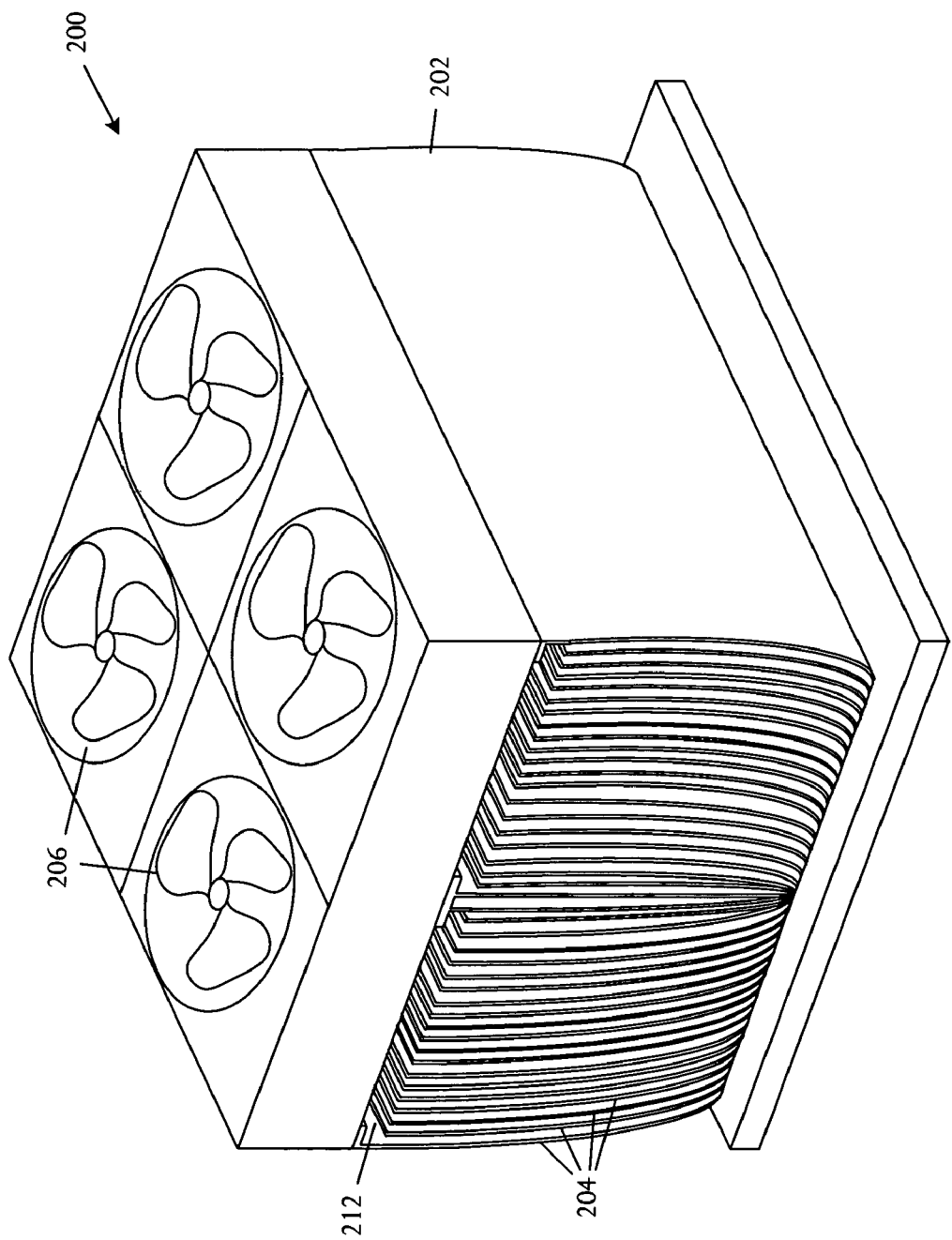
FIG. 2 is a schematic pictorial diagram illustrating an embodiment of an active heat sink in a configuration with a plenum space positioned between heat sink fins and multiple fans.

Referring to FIG. 2, a schematic pictorial diagram illustrates an embodiment of an active heat sink 200 in a configuration with a plenum space 212 positioned between heat sink fins 204 of the heat sink 202 and multiple fans 206 in a parallel redundant arrangement. The plenum 212 positioned between the fans 206 and the heat sink fins 204 enable proper mixing of air from the individual fans so that the heat sink fins 204 receive a relatively uniform airflow, even under conditions of fan failure.

Figure 3A:
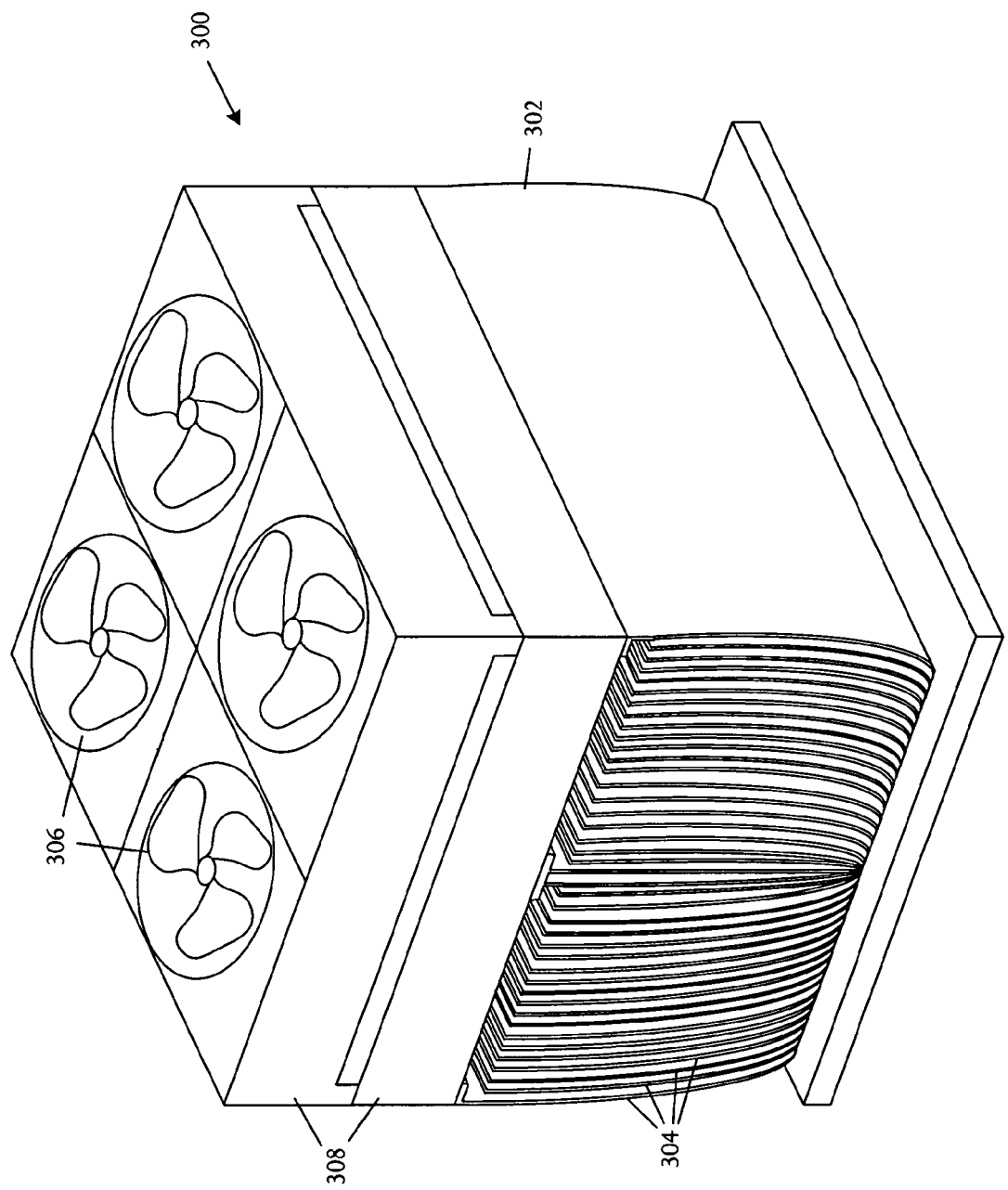
FIGS. 3A, 3B, and 3C are schematic pictorial diagrams respectively showing embodiments of active heat sinks formed with multiple fans configured in a serial redundant arrangement.
Figure 3B:
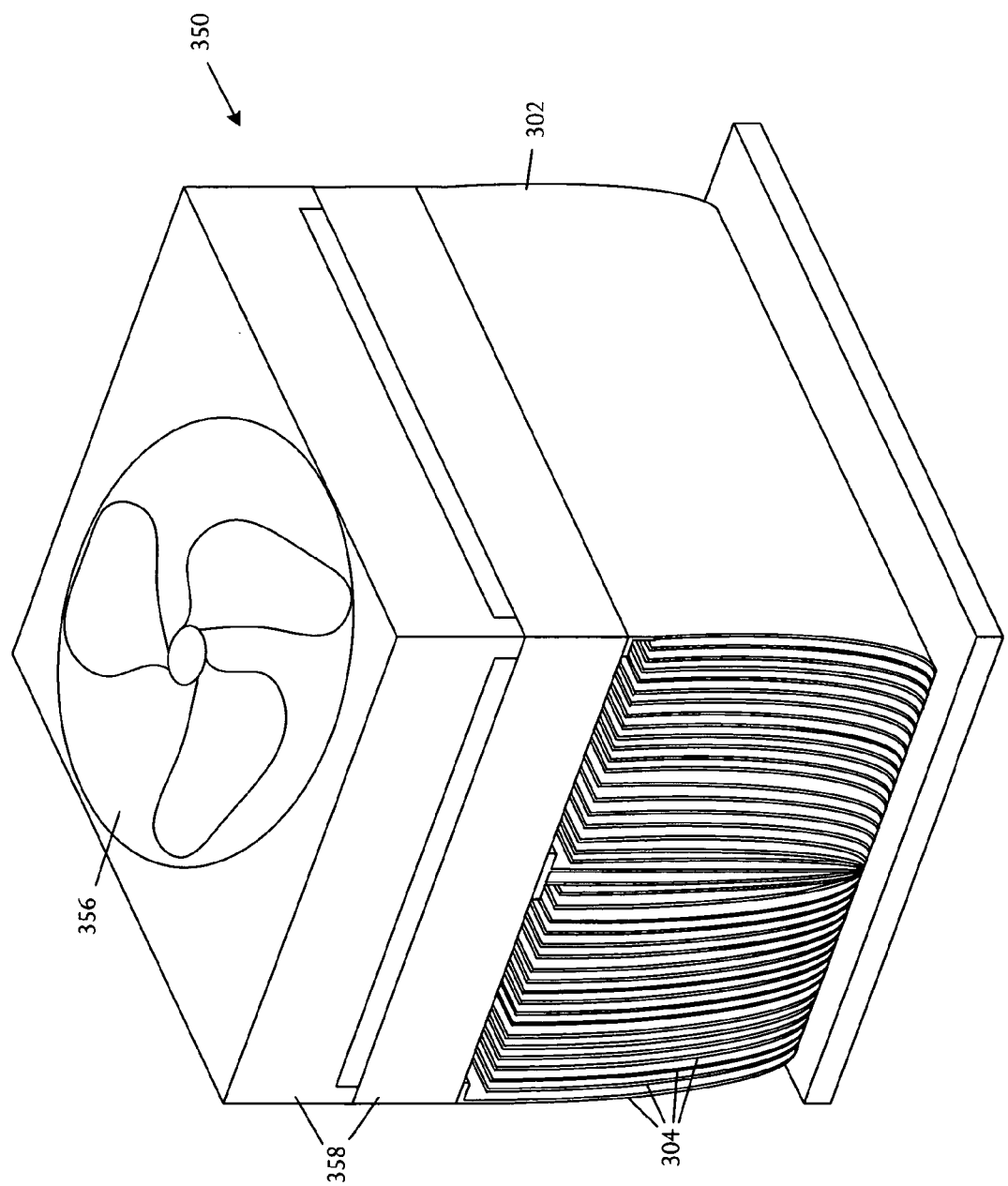

Referring to FIGS. 3A and 3B, schematic pictorial diagrams respectively illustrate embodiments of an active heat sink 300 and 350 formed with multiple fans 306 configured with two fan layers 308 in a serial redundant arrangement. The multiple fans 306 configured in serial enable operation in a serial redundant arrangement with the two fan layers 308 connected in series upstream of the heat sink 302 pushing airflow toward the heat sink fins 304. FIG. 3A shows an arrangement with multiple fans 306 in two fan layers 308 upstream of the heat sink 302, forming multiple serial redundant channels. FIG. 3B is an arrangement 350 with a single fan 356 in each of two layers 358 upstream of the heat sink 302 in a single serial redundant channel.

Figure 3C:
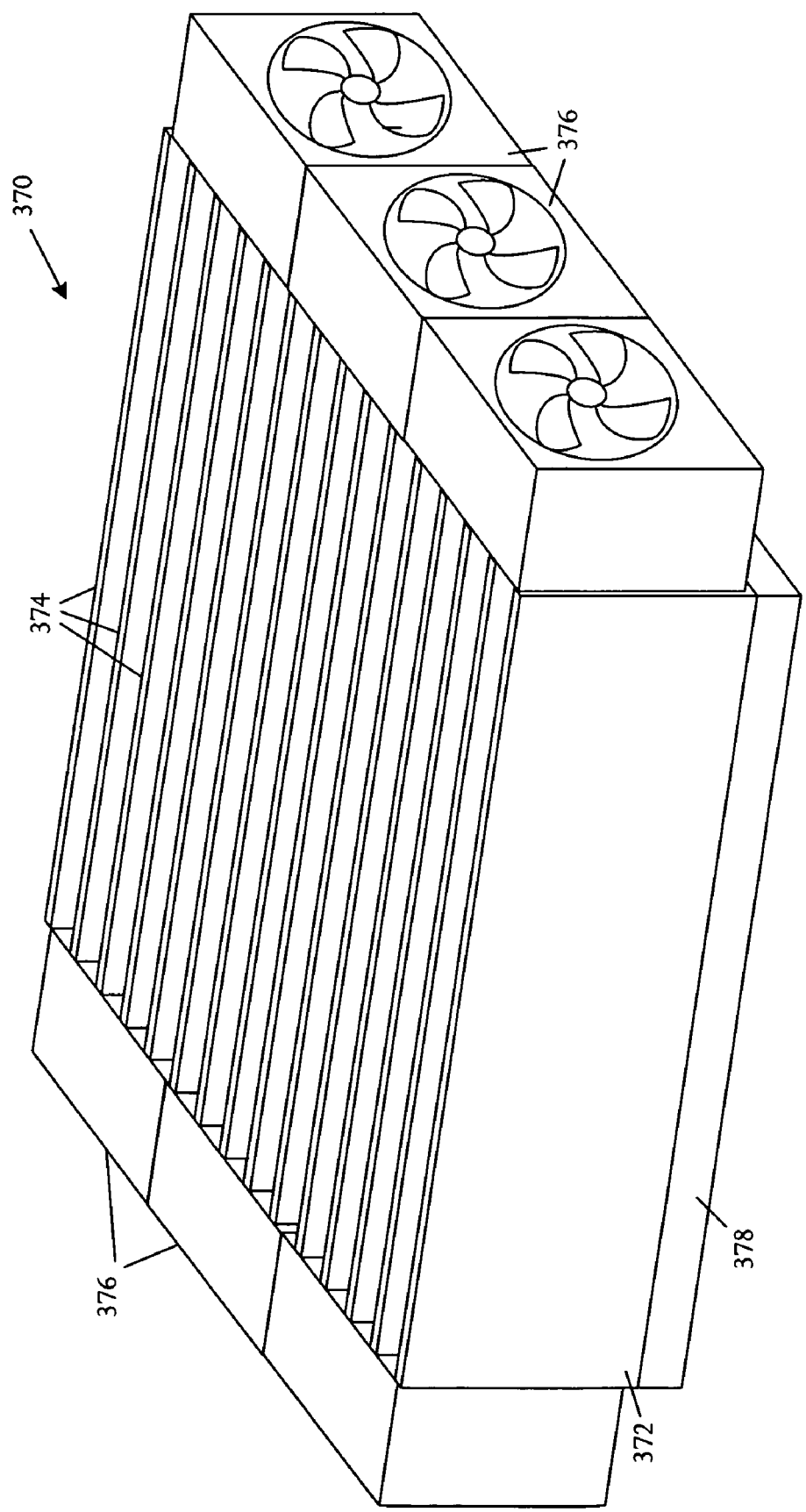

FIG. 3C is a perspective pictorial diagram illustrating an embodiment of an active heat sink 370 with a combined parallel and serial fan configuration. The active heat sink 370 includes a heat sink 372 with parallel planar fins 374. The heat sink 372 is shown attached to a component 378 to be cooled, for example a processor chip. Rather than positioning the fans in a plane opposing the component 378 so that the fans cool by impingement, the fans 376 are arranged in two planes on opposing sides of the heat sink 372 whereby airflow pathways flow over the component 378 from one side to the other.

Fans may be arranged in parallel or in series. The parallel arrangement may have some advantages. In the serial arrangement, the failure of a single fan may create a significant airflow backpressure due to the presence of stationary fan blades in the flow path. The parallel arrangement reduces or eliminates the airflow backpressure.

Figure 4:
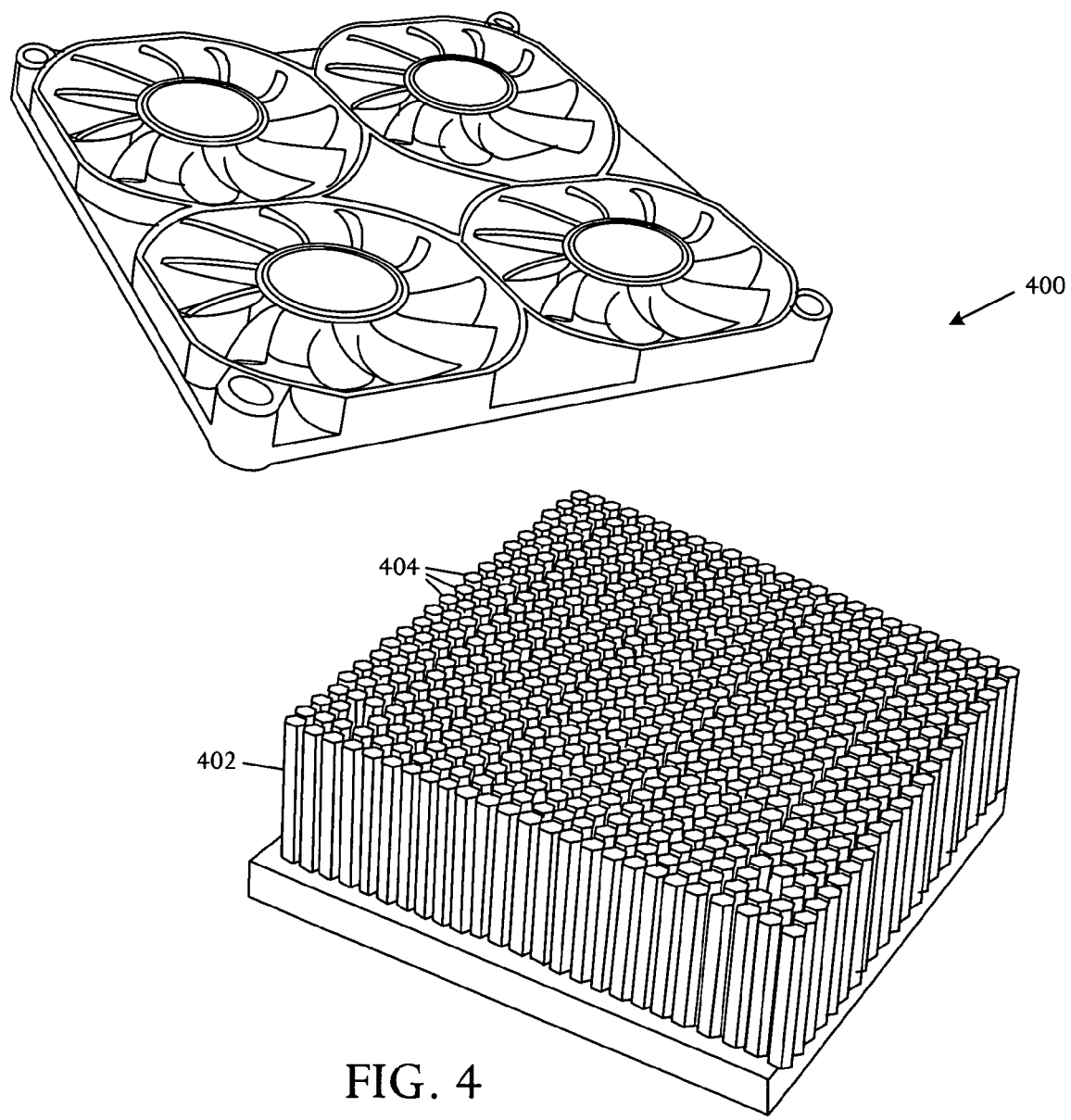
FIG. 4 is a perspective pictorial diagram illustrating an embodiment of a multiple-fan active heat sink including a heat sink with hexagonal pin fins.

The illustrative embodiments shown in FIGS. 1A, 1B, 2, 3A, 3B, and 3C are configurations using heat sinks with planar fins. Referring to FIG. 4, a perspective pictorial diagram illustrates an embodiment of a multiple-fan active heat sink 400 including a heat sink 402 with hexagonal pin fins 404. Heat sinks with any appropriate type of fins may be used, for example also including cylindrical pin fins, square pin fins, and others. Pins may be plate fins, pin fins, crimped fins, and the like and are typically constructed by machining or extrusion, although any suitable fabrication technique may be used.

To eliminate recirculation through a failed fan, individual fans may be equipped with a backflow prevention apparatus or device. Various compact and economic backflow prevention structures can be implemented interior to the fans or within a plenum space. Referring to FIGS. 5A and 5B, and FIGS. 6A through 6F, two examples of fans are shown configured with a backflow prevention apparatus coupled to the multiple fans. The illustrative cooling fans dynamically respond to a failure condition by increasing blockage of a fan for example by expanding structural fan members, thereby blocking airflow and reducing or preventing recirculation of heated air.

Figure 5A:
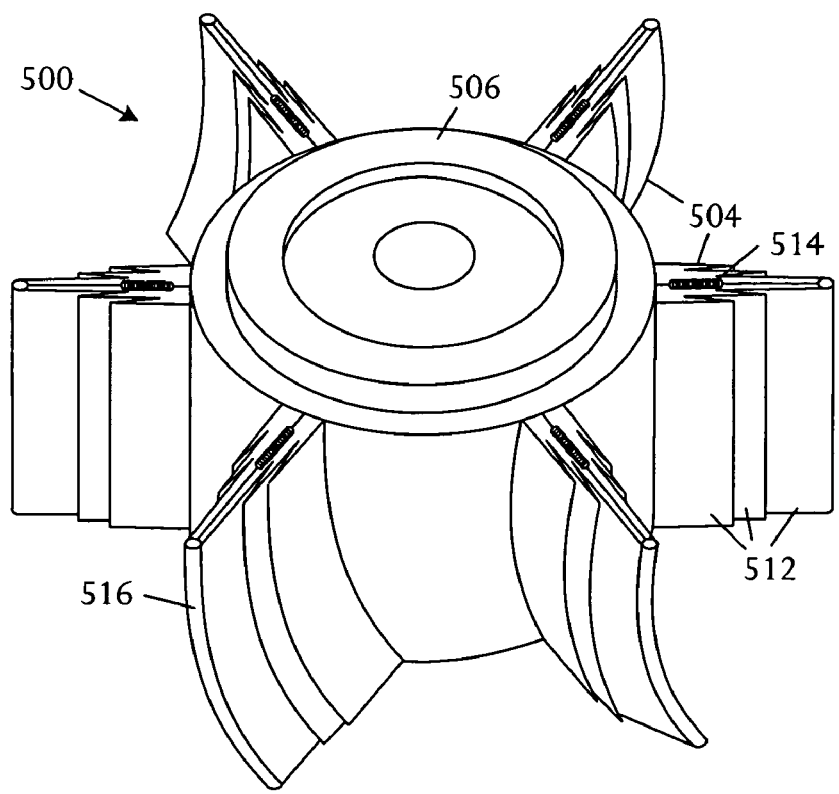
FIGS. 5A and 5B are perspective pictorial diagrams depicting an embodiment of a fan assembly 500 adapted to increase blockage of a fan upon fan failure.
Figure 5B:
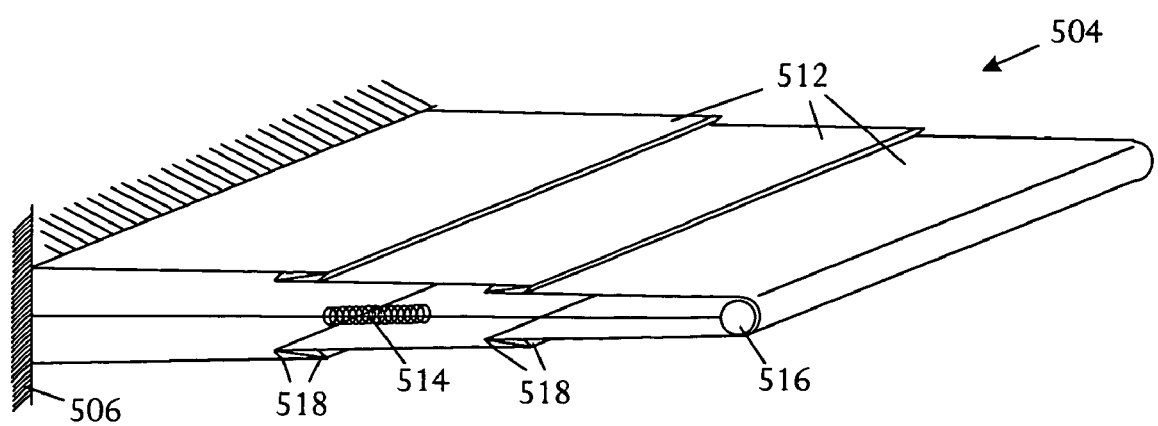

Referring to FIG. 5A, a perspective pictorial diagram illustrates an embodiment of a fan assembly 500 adapted to increase blockage of a fan upon fan failure. The illustrative fan assembly 500 comprises a hub 506 and one or more collapsible fan blades 504 each constructed as a plurality of telescoping sheeting layers 512 and at least one spring 514. The telescoping sheeting layers 512 function as a mass element which is distinct from the spring 514 so that spring and mass functionality are distinct in the illustrative embodiment shown in FIG. 5A.

The telescoping sheeting layers 512 form the fan blade 504 in multiple sections constructed from a suitable material such as plastic or metal that unfold or unfurl outward under centrifugal force and that collapse or retract when the fan stops spinning. Collapse of the metal or plastic sheets reduces or minimizes the cross-sectional area of the blade 504. In some implementations, the metal or plastic sheets may comprise a suitable mass upon which the centrifugal force acts and the fan may spin sufficiently fast so that the blade extends without addition further material or mass. In other implementations, additional weight or mass may be added to the structure to ensure extension. The telescoping sheeting layers 512 generally do not inherently have sufficient resilience for automatic retraction. Accordingly, the spring 514 is attached to retract the blade 504 when the centrifugal force decreases due to reduction or termination of angular motion.

The telescoping sheeting layers 512 may be configured as very thin and rigid flat plates, each having a form selected to create an aerodynamic fan blade shape as centrifugal force expands the blade 504.

The mass distribution of the sheeting layers 512 and the elastic characteristics of the spring or springs 514 are selected in combination with selected fan speed specifications to produce appropriate response to centrifugal forces. Mass and elastic properties are balanced to extend the collapsible fan blades 504 during fan rotation at a selected minimum speed and otherwise collapsing the blades. In some arrangements, the multiple sheeting layers may have the same mass distribution. In other embodiments, sheets may have differing mass distributions. Similarly, sheets with a mass distribution varies in planar space may be used. Some implementations may use mass elements, for example weight blocks, attached selectively to the sheeting layers. The illustrative embodiment has a mass element 516 attached to the distal edge of the sheeting layer most distal from the hub 506.

The telescoping sheeting layers 512 are configured with a mass configuration and the one or more springs 514 selected to have a spring force appropriate to create a centrifugal force that exceeds the spring force during fan rotation. The telescoping sheeting layers 512 have flanges 518, shown in FIG. 5B, that limit excursion of the collapsible fan blades 504 to a selected radial distance.

Referring to FIGS. 6A through 6F, multiple perspective pictorial diagrams illustrate an embodiment of an electronics cooling fan 600 that uses extendable flaps to control air flow by selectively varying the thickness of structures within the air flow pathway.

The fan 600 includes an airflow stabilizer 608 adapted to direct airflow through the electronics cooling fan 600. The airflow stabilizer 608 includes multiple members 610 that contract during rotational motion and expand when the rotational motion slows or terminates, constricting the airflow through the fan 600.

The electronics cooling fan 600 includes a stator 604 and a rotor 606 arranged in combination with the stator 604 and adapted for rotational motion. Multiple fan blades 602 are attached to the rotor 606. Multiple stator blades 612 are attached to the stator 602. The individual stator blades 612 include a flap 614 pivotally coupled to the stator blade 612 by a hinge pin 616. The flap 614 is configured to abut the stator blade 612 during rotation and extend from the stator blade 612 when the rotational motion slows or terminates.

FIGS. 6A through 6F depict an embodiment of the fan 600 that restricts flow on failure of the fan 600 or a motor driving the fan. The fan 600 is useful in systems with cooling components configured with fans arranged in parallel to prevent or reduce recirculation of air through a failed fan, for example if only one of two fans is operational. The flaps 614 in the fan 600 close, for example with flaps 614 extending upward, due to air pressure which otherwise induces air to flow backwards through the failed fan. In normal operation, when the fan is working, the flaps 614 are in the open position, for example with flaps extending downward.

Figure 6A:
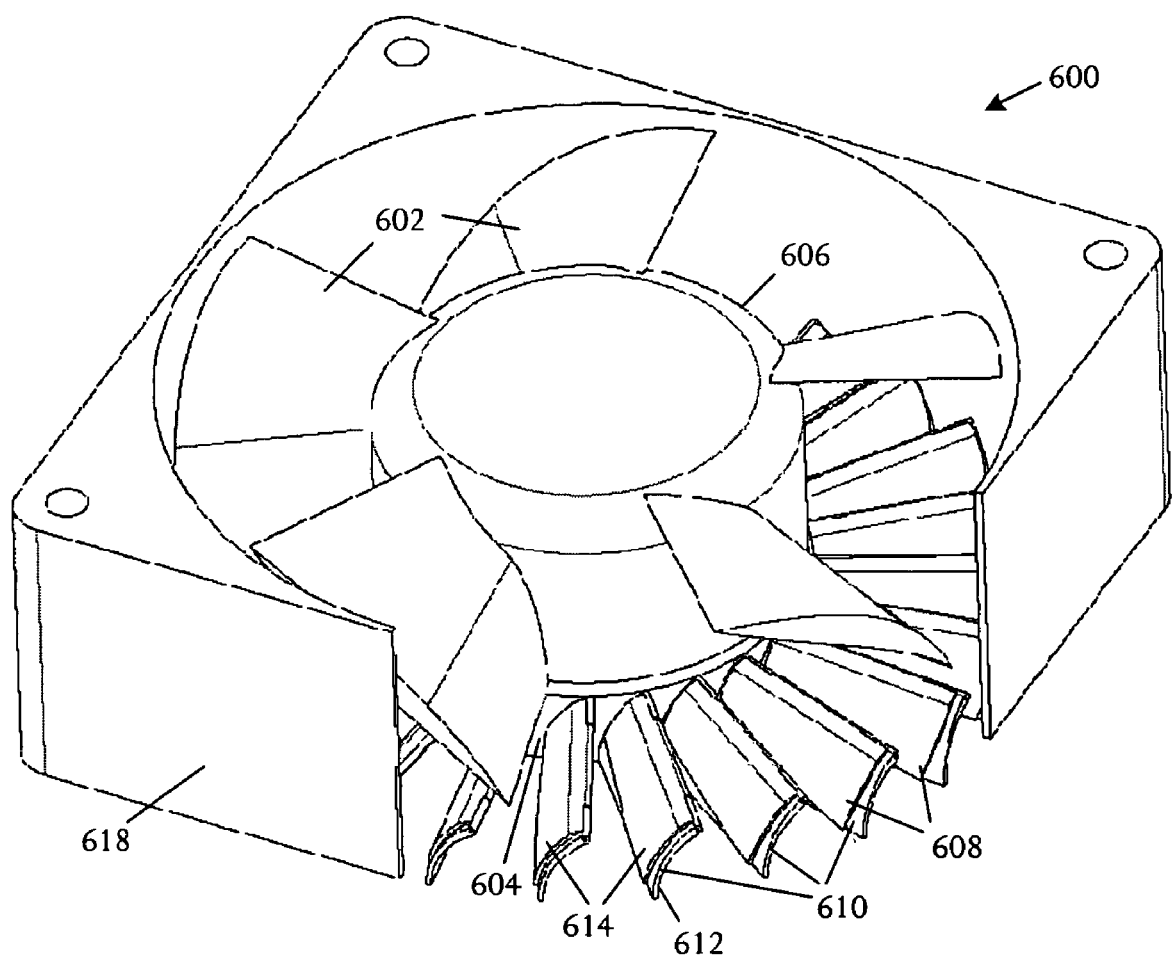
FIGS. 6A through 6F depict multiple perspective pictorial diagrams illustrating an embodiment of an electronics cooling fan that uses extendable flaps to control air flow by selectively varying the thickness of structures within the air flow pathway.
Figure 6B:
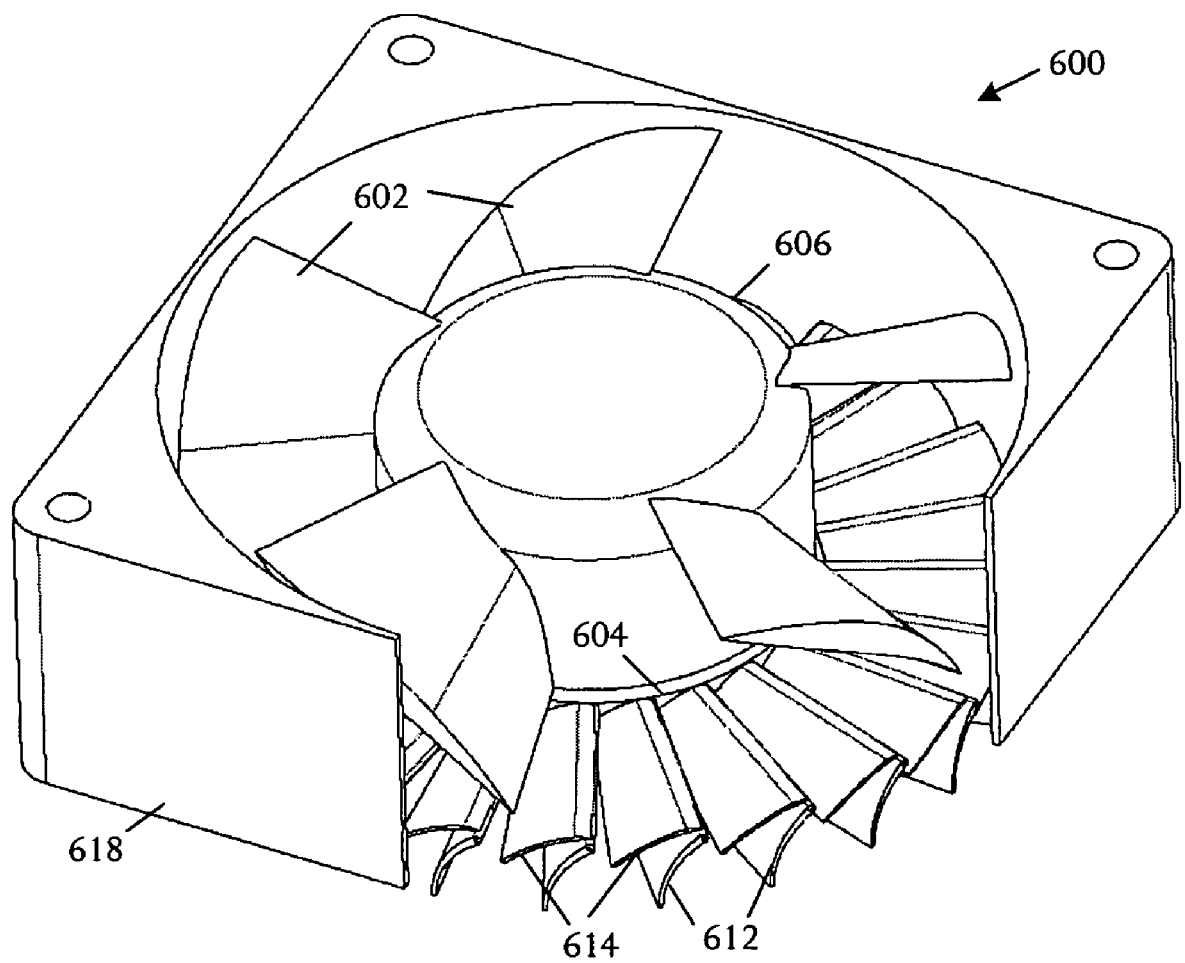
Figure 6C:
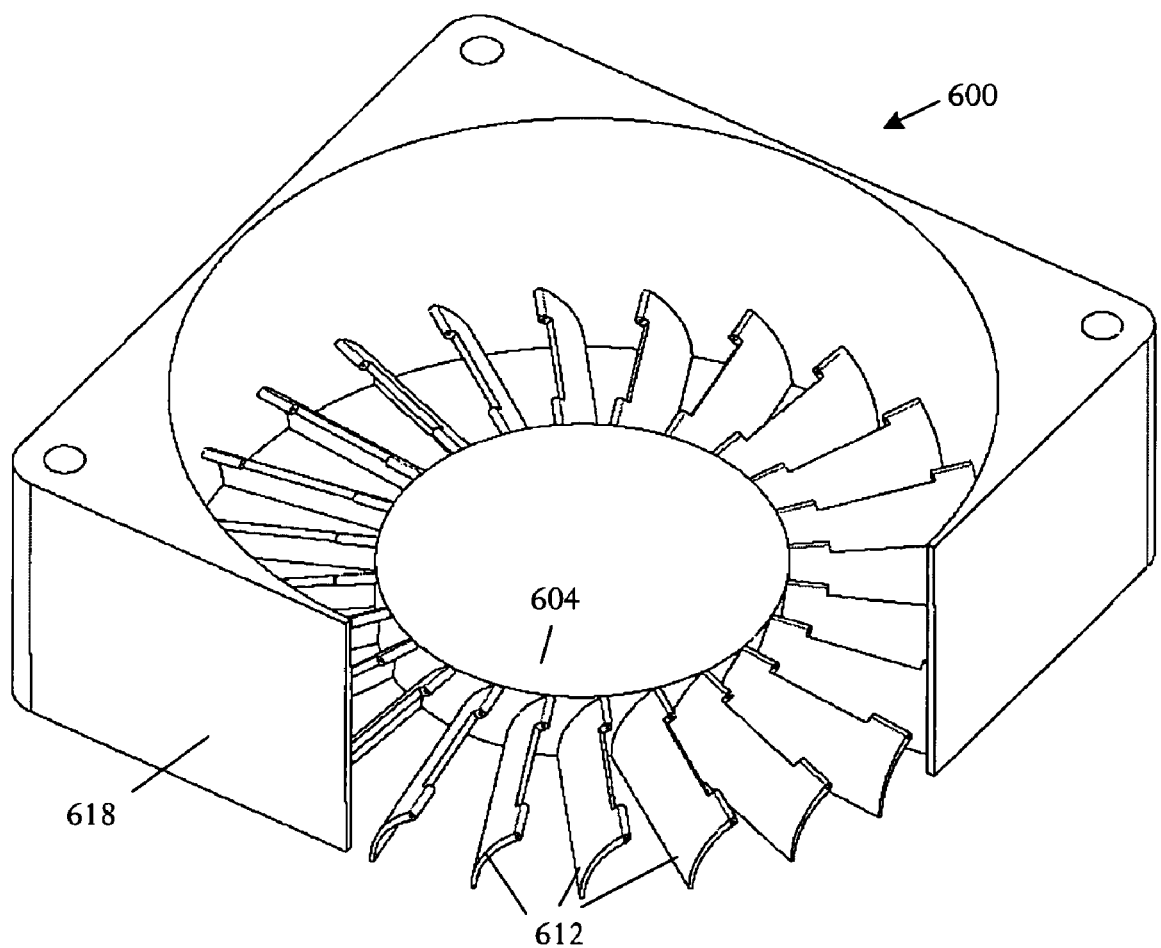
Figure 6D:
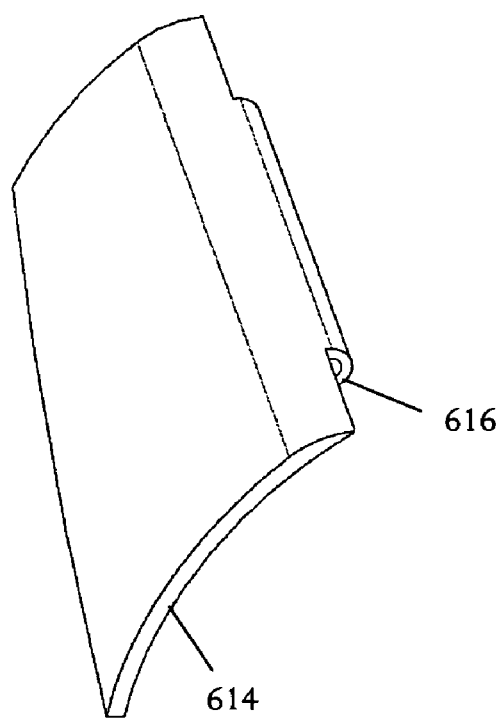
Figure 6E:
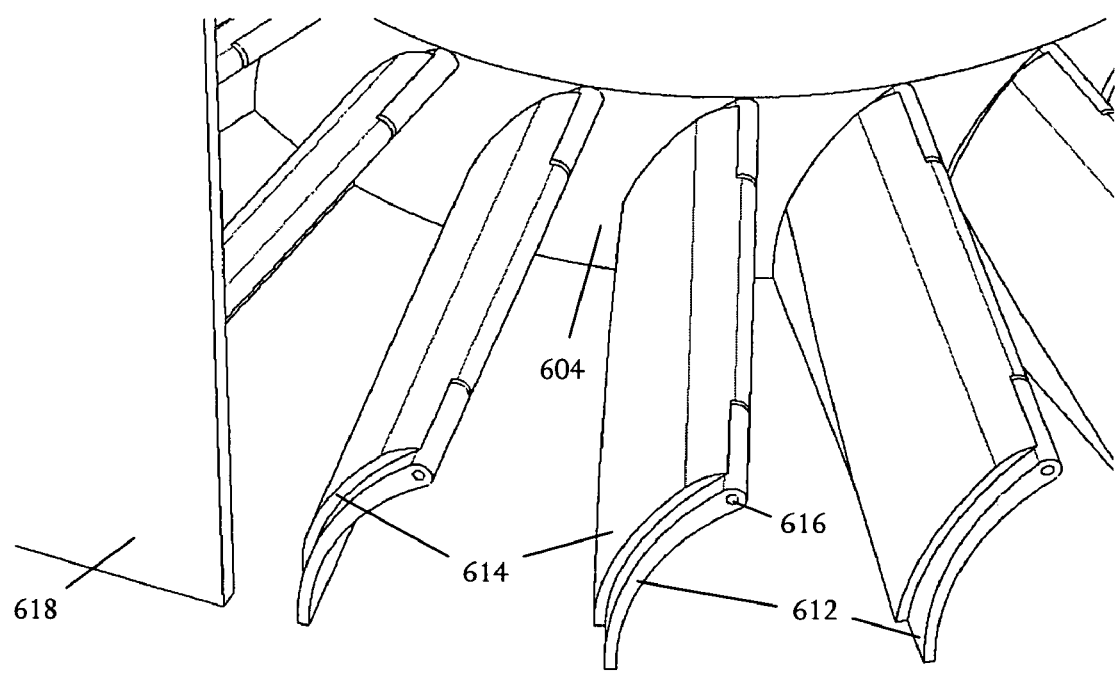
Figure 6F:
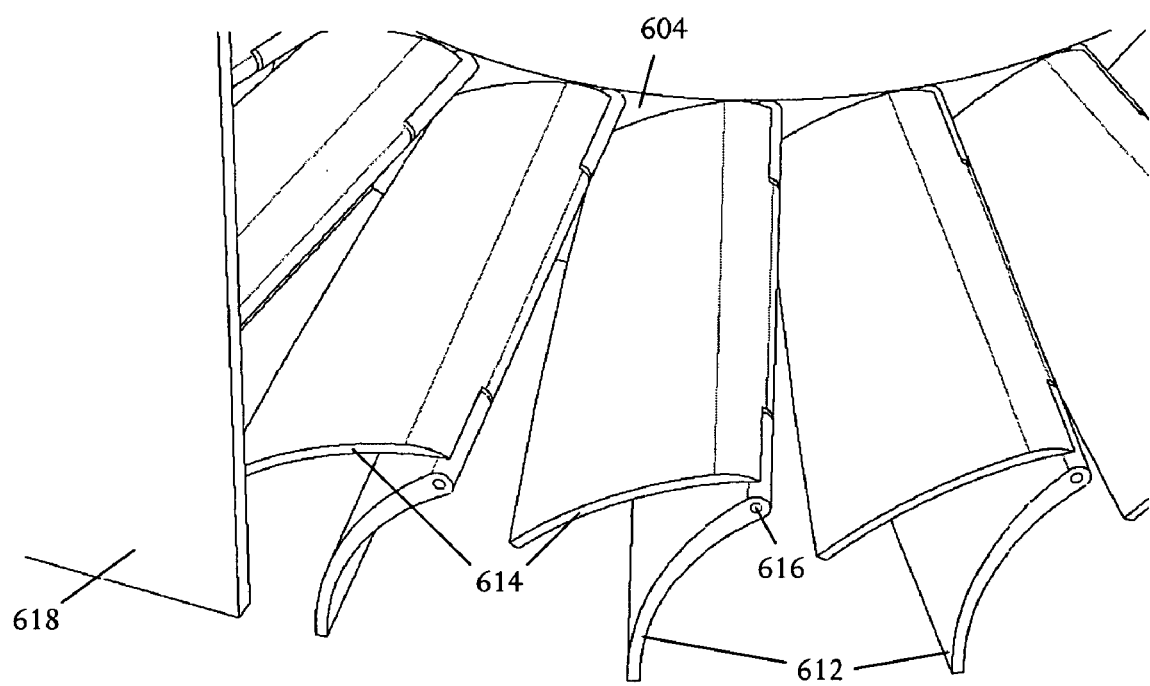

FIG. 6A depicts the fan assembly 600 with flaps 614 extending downward, with the fan operational. FIG. 6B shows the fan assembly 600 with flaps 614 in the upward configuration, the arrangement occurring with a failed fan. FIG. 6C shows the fan housing 618 with fixed stator blades 612. FIG. 6D illustrates a close-up view of the flap 614 which connects to each stator blade 612 via a hinge pin 616. FIG. 6E shows a close-up view of flaps 614 in the down position. FIG. 6F shows a close-up view of the flaps 614 in the up position.

Figure 7:
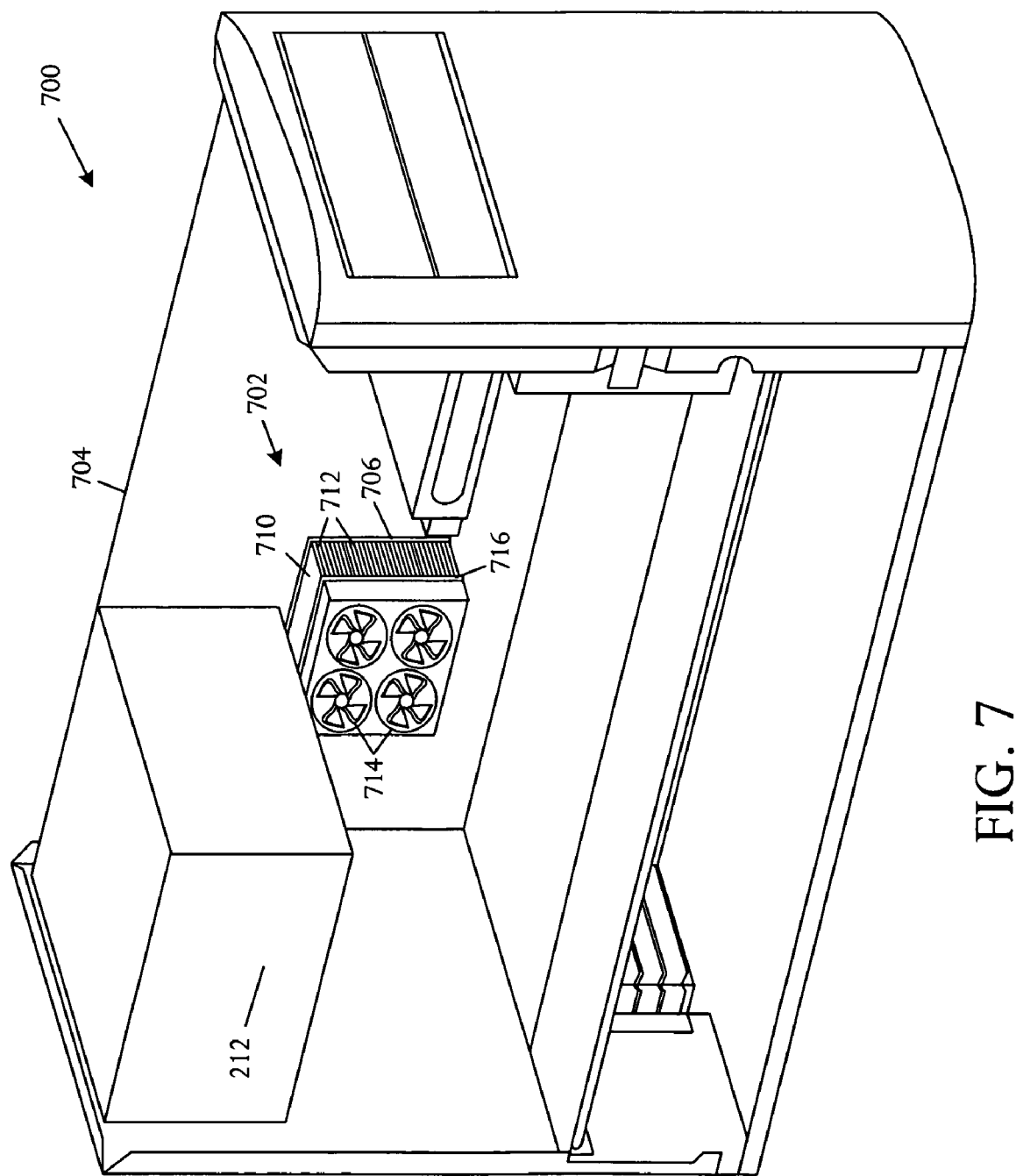
FIG. 7 is a perspective pictorial diagram showing an embodiment of an electronic device with a thermal design including a multiple-fan active heat sink.

Referring to FIG. 7, a perspective pictorial diagram illustrates an embodiment of an electronic device 700 with a thermal design which includes a multiple-fan active heat sink 702. The electronic device 700 may be any suitable device type, for example a computer system, a host, a storage device, a communication device, a special-purpose processor, and the like. The illustrative electronic device 700 comprises a chassis 704 and one or more components 706 contained within the chassis 704, and one or more active heat sinks 702 configured to supply cooling to components 706. An active heat sink 702 comprises a heat sink 710 with multiple fins 712 and multiple fans 714 which are configured in a redundant arrangement and coupled to the heat sink 710.

In the illustrative example, the fins 712 are planar sheet fins arranged in multiple parallel planes and the multiple fans 714 are horizontal tube-axial fans attached in a plane perpendicular to the multiple heat sink fins 712. The multiple fans 714 are shown arranged in a parallel, forming multiple parallel airflow paths and injecting air into the heat sink 710. The illustrative active heat sink 702 has four fans integrally coupled in parallel in the plane perpendicular to the fins 712. Other embodiments may have fans configured in other arrangements. For example, fans can be arranged serially such as in serial on either side of a heat sink or in serial on one side of the heat sink, for example enabling the multiple fans to be configured in a push-pull arrangement.

A plenum layer 716 is shown positioned between the heat sink fins 712 and the multiple fans 714 to enable an appropriate level of mixing of air from the individual fans 714 so that all heat sink fins 712 receive a relatively uniform airflow even in the event of failure of one of the fans 714.

To eliminate recirculation through a failed fan, the individual fans may be equipped with a backflow prevention apparatus. Various elements are sufficiently compact and economical, and adaptable to function within the plenum space 716.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of fan structures, heat sink configurations, fan arrangements, and fan number are depicted. Any suitable arrangement of configuration of fans and heat sinks may be implemented. The illustrative active heat sinks may be used in any appropriate electronic system or device, such as suitable servers, computers, consumer electronics devices, communication systems and devices, storage system, and others.

In the claims, unless otherwise indicated the article "a" is to refer to "one or more than one."

What is claimed is:

1. An active heat sink comprising:
a heat sink comprising a plurality of heat sink fins coupled to an electronic device and extending perpendicular from the electronic device to terminate at a mounting plane parallel to the electronic device; and
a plurality of fans configured in a redundant abutting arrangement affixed to the heat sink at the mounting plane and separated from the heat sink fins at the mounting plane by a plenum space wherein the redundant abutting fan arrangement drives airflow through the common plenum space, enabling mixing of air from the fan plurality whereby the heat sink fins receive uniform airflow under conditions of failure of a fan of the fan plurality.

2. The active heat sink according to claim 1 further comprising:
a plurality of abutting horizontal tube-axial fans arranged in a plane overlying an arrangement of vertically-extending heat sink fins.

3. The active heat sink according to claim 1 further comprising:
the plurality of fans configured in a parallel redundant abutting arrangement.

4. The active heat sink according to claim 1 further comprising:
the plurality of fans configured in a serial redundant abutting arrangement.

5. The active heat sink according to claim 1 further comprising:
a backflow prevention apparatus coupled to the fan plurality that dynamically responds to a failure condition by increasing blockage of a failed fan and blocking airflow whereby recirculation of heated air is reduced.

6. The active heat sink according to claim 1 further comprising:
a backflow prevention apparatus coupled to the fan plurality configured to eliminate recirculation through a failed fan of the fan plurality.

7. The active heat sink according to claim 1 further comprising:
the plurality of fans configured in a push-pull arrangement.

8. An electronic device comprising:
a chassis;
at least one component contained within the chassis; and
an active heat sink adapted to cool the at least one component, the active heat sink further comprising:
a heat sink comprising a plurality of heat sink fins coupled to an electronic device and extending perpendicular from the electronic device to terminate at a mounting plane parallel to the electronic device; and
a plurality of fans configured in a redundant abutting arrangement affixed to the heat sink at the mounting plane and separated from the heat sink fins at the mounting plane by a plenum space wherein the redundant abutting fan arrangement drives airflow through the common plenum space, enabling mixing of air from the fan plurality whereby the heat sink fins receive uniform airflow under conditions of failure of a fan of the fan plurality.

9. The electronic device according to claim 8 wherein the active heat sink further comprises:
a plurality of abutting horizontal tube-axial fans arranged in a plane overlying an arrangement of vertically-extending heat sink fins.

10. The electronic device according to claim 8 wherein the active heat sink further comprises:
the plurality of fans configured in a parallel redundant abutting arrangement.

11. The electronic device according to claim 8 wherein the active heat sink further comprises:
the plurality of fans configured in a serial redundant abutting arrangement.

12. The electronic device according to claim 8 wherein the active heat sink further comprises:
a backflow prevention apparatus coupled to the fan plurality that dynamically responds to a failure condition by increasing blockage of a failed fan and blocking airflow whereby recirculation of heated air is reduced.

13. The electronic device according to claim 8 wherein the active heat sink further comprises:
a backflow prevention apparatus coupled to the fan plurality configured to eliminate recirculation through a failed fan of the fan plurality.

14. The electronic device according to claim 8 wherein the active heat sink further comprises:
the plurality of fans configured in a push-pull arrangement.

15. A method comprising:
providing a heat sink comprising a plurality of heat sink fins coupled to an electronic device and extending perpendicular from the electronic device to terminate at a mounting plane parallel to the electronic device;
configuring a plurality of fans in a redundant abutting arrangement; and
affixing the plurality of fans to the heat sink at the mounting plane and separated from the heat sink fins at the mounting plane by a plenum space wherein the redundant abutting fan arrangement drives airflow through the common plenum space, enabling mixing of air from the fan plurality whereby the heat sink fins receive uniform airflow under conditions of failure of a fan of the fan plurality.

16. The method according to claim 15 further comprising:
arranging a plurality of abutting horizontal tube-axial fans in a plane overlying an arrangement of vertically-extending heat sink fins.

17. The method according to claim 15 further comprising:
configuring the plurality of fans in a parallel redundant abutting arrangement.

18. The method according to claim 15 further comprising:
configuring the plurality of fans in a serial redundant abutting arrangement.

19. The method according to claim 15 further comprising:
inserting a backflow prevention apparatus to the fan plurality that dynamically responds to a failure condition by increasing blockage of a failed fan and blocking airflow whereby recirculation of heated air is reduced.

20. The method according to claim 15 further comprising:
coupling a backflow prevention apparatus to the fan plurality; and
configuring the backflow prevention apparatus to eliminate recirculation through a failed fan of the fan plurality.

* * * * *